United States Patent [19]

Tsubai et al.

[11] 4,220,702

[45] Sep. 2, 1980

[54] METHOD FOR MAKING A LITHOGRAPHIC PRINTING PLATE

[75] Inventors: Yasuo Tsubai; Shigeyoshi Suzuki, both of Nagaokakyo, Japan

[73] Assignee: Mitsubishi Paper Mills, Ltd., Tokyo, Japan

[21] Appl. No.: 944,072

[22] Filed: Sep. 20, 1978

[30] Foreign Application Priority Data

Dec. 15, 1977 [JP] Japan ................................ 52-151104

[51] Int. Cl.² .......................... G03C 5/54; G03F 7/02
[52] U.S. Cl. ..................................... 430/204; 430/302
[58] Field of Search ........................... 96/29 L, 33, 76; 101/130, 472, 416 R

[56] References Cited

U.S. PATENT DOCUMENTS

| | | | |
|---|---|---|---|
| 3,128,181 | 4/1964 | Doggett | 96/33 |
| 3,254,597 | 6/1966 | Hart et al. | 96/33 |
| 3,547,632 | 12/1970 | Nadeav | 96/33 |
| 3,547,641 | 12/1970 | Blake | 96/76 |
| 3,721,559 | 3/1973 | Detlaes et al. | 96/33 |
| 3,904,412 | 9/1975 | Serrien et al. | 96/29 L |

FOREIGN PATENT DOCUMENTS

| | | | |
|---|---|---|---|
| 1004342 | 9/1965 | United Kingdom | 96/33 |
| 1071163 | 6/1967 | United Kingdom | 96/33 |

*Primary Examiner*—J. Travis Brown
*Attorney, Agent, or Firm*—Cushman, Darby and Cushman

[57] ABSTRACT

A lithographic printing plate which utilizes a photographic process and which is excellent in ink-repellency of non-image areas, have no stains with oily materials or fingerprints of workers, shows no reduction of ink-repellency of non-image areas and ink-receptivity of image areas with the lapse of time and can provide prints with no stains and clear images is produced by a neutralizing solution used in photographic treatment containing colloidal fine particles, preferably in combination with a hygroscopic polyol compound.

7 Claims, No Drawings

METHOD FOR MAKING A LITHOGRAPHIC PRINTING PLATE

BACKGROUND OF THE INVENTION

This invention relates to a method for producing a lithographic printing plate which uses a silver image which is formed by a photographic process and is rendered ink-receptive and more particularly it concerns a neutralizing process after development in the photographic process.

As an example of a lithographic printing plate which uses a silver image formed by a photographic process, namely image exposure, development and rendering of the plate ink-receptive, there is such a printing plate which uses a silver complex salt diffusion transfer process. Representative examples of such printing plates are disclosed in Japanese Patent Publication No. 16725/73 and No. 30562/73, U.S. Pat. No. 3,721,559 and No. 3,490,905, Japanese Patent Application No. 95276/76, etc. According to these examples, the metallic silver image produced is directly rendered ink-receptive or is rendered oleophilic and thus ink-receptive.

Lithographic printing plates consist of oleophilic image areas receptive to oily inks and oleophobic non-image areas non-receptive to inks and generally the non-image areas comprise hydrophilic portions receptive to water. Therefore, both ink and water are applied to the surface of an ordinary lithographic printing plate so that the image areas selectively receive coloring ink and the non-image areas selectively receive water. Then, the ink on the image areas is transferred to a substrate such as paper. Therefore, in order to obtain good prints, it is necessary that the difference between the hydrophilicity and oleophilicity of the surface of the image area and non-image area is very large such that the image area receives sufficient ink and the non-image area receives no ink when ink and water are applied to the surface of the plate. Furthermore, it is commercially important that this property is stably maintained over a long period of time after plate making.

The lithographic printing plate of this invention is based on the same theory as mentioned above. Hitherto, various attempts have been made to increase ink-receptivity of the image area and ink-repellency of the non-image area to make large the difference between the oleophilicity of the image area which should receive inks and the hydrophilicity of the non-image area which should repel inks. However, satisfactory result has not yet been obtained. Especially, if the ink-repellency of the non-image area is insufficient, such printing plate has a fatal defect. That is, ink sticks to the surface of the non-image area during printing to stain seriously the non-image area of prints. Presence or absence of the stains of ink depends on water retentivity of the surface of original plate per se for lithographic printing plate, water retentivity of the surface of printing plate imparted by treatment for making the surface insensible to oil and water retentivity imparted by dampening solution supplied during printing. However, there are causes for stain with ink at various stages in plate making step (including photographic treatment and treatment for printing) and printing step, e.g., (1) sticking of oily materials to the surface of printing plates or leaving of fingerprints of workers during photographic treatment, (2) sticking of oily materials to the surface of printing plates or leaving of fingerprints of workers at treatment for printing after photographic treatment or reduction of water retentivity of the surface of printing plate with the lapse of time while the plates being left between the steps and (3) leaving of fingerprints of workers to the surface of printing plates, sticking of oily materials (including sticking of ink) or reduction of water retentivity with lapse of time during printing. In the case of the plate making according to this invention, there is little possibility of causing stains with ink during photographic treatment because generally, in many cases, the photographic treatment (development-neutralization treatments) is systematically conducted with image exposure step and in many cases causes for stains with ink at stages (2) and (3) referred to above become problems. It is clear that causes for stains with ink are most likely to occur before the treatment for making the surface of printing plate insensible to oil in the stage (2), namely, between the photographic treatment and treatment for printing. Besides, the printing plates are often left to stand after photographic treatment and before treatment for printing due to some reasons in plate making operation or printing operation and the treatment for making the surface of printing plates insensible to oil is carried out immediately before starting of printing. In view of these facts, it is important to prevent causes for stains with ink during leaving the printing plates as they are.

SUMMARY OF THE INVENTION

The object of this invention is to provide a method for making a lithographic printing plate which utilizes a photographic process and which provides non-image areas excellent in ink-repellency without giving adverse effect on ink-receptivity of image areas.

Another object of this invention is to provide a method for making a lithographic printing plate which utilizes a photographic process and which can avoid sticking of oily materials to the surface and leaving of fingerprints of workers to the surface during leaving the printing plates as they are after photographic treatment, during treatment for printing and during printing and which can provide prints having no stain with ink and having clear print images.

Still another object of this invention is to provide a method for making a lithographic printing plate which utilizes a photographic process and which can prevent reduction of ink-repellency of non-image areas and ink-receptivity of image areas, especially the former characteristic, with the lapse of time during leaving the plates as they are after photographic treatment.

The objects of this invention as mentioned above have been attained by the neutralizing solution used in photographic treatment containing colloidal fine particles or more preferably colloidal fine particles in combination with hygroscopic polyol compounds.

That is, this invention relates to a method for making a lithographic printing plate which comprises subjecting an original plate for a lithographic printing plate having silver image areas formed by a photographic process and rendered ink-receptive to the photographic treatment of development and neutralization and the treatment of making the non-image areas insensible to oil, characterized in that the neutralizing solution used in the photographic treatment contains colloidal fine particles or more preferably the colloidal fine particles with hygroscopic polyol compounds.

DETAILED DESCRIPTION OF THE INVENTION

The colloidal fine particles used in this invention mean fine particles which are stably dispersed in colloidal state and preferably which have a particle size of less than about 100 mµ. Representative examples thereof are colloidal silica, colloidal alumina and the like and among them colloidal silica is preferred. They may be used in an amount of about 0.01–1 g/l, preferably 0.05–0.5 g/l, as particle solid matter in the neutralizing solution. With increase in the amount of the colloidal fine particles the effect of this invention increases, but when too much, the ink-receptivity of image areas decreases. Hence, it is not preferred to use them in an amount exceeding said range.

The hygroscopic polyol compounds used effectively in this invention are hygroscopic compounds having at least 2 hydroxyl groups. Specific examples thereof are ethylene glycol, diethylene glycol, triethylene glycol, tetraethylene glycol, α-propylene glycol, glycerine and polyethylene glycol (having an molecular weight of not more than 1000, especially 200–400), among which ethylene glycol, diethylene glycol, α-propylene glycol and glycerine of relatively low molecular weight are preferred. Amount of the polyol compounds added to the neutralizing solution may be 0.1–50 g/l, preferably 1–30 g/l. When the amount is too much, printing plates after subjected to photographic treatment can be dried with difficulty and problems occur during being left to stand. Moreover, ink-receptivity of image areas is deteriorated.

It is known to use colloidal fine particles such as colloidal silica and/or hygroscopic polyol compounds such as ethylene glycol for lithographic printing plates utilizing a photographic process or in treatment for printing after subjected to photographic treatment. For example, U.S. Pat. No. 3,344,741 discloses that colloidal silica is contained in a constructive element of printing plates. This U.S. patent relates to a lithographic printing plate utilizing the silver complex diffusion transfer process and colloidal silica is contained in an under-coat layer, namely, a layer between a support and a layer containing nuclei for physical development. In this case, however, the colloidal silica does not provide water retention effect of the surface of the printing plate and does not make contribution to improvement of ink-repellency. Thus, the object of this invention cannot be attained. The present inventors have made an attempt to incorporate colloidal fine particles into a layer containing nuclei for physical development or a layer immediately below said nuclei containing layer (this latter layer may be a silver halide emulsion layer). However, the colloidal silica sometimes gives adverse effect on the deposited silver transferred onto the nuclei for physical development by the silver complex diffusion transfer development. Consequently, ink-receptivity of the silver image area is reduced or adhesion strength between the deposited silver and the layer which supports the deposited silver is decreased to result in deterioration in printability. Moreover, the colloidal silica added has no effect of improving the problems caused when the printing plates are left to stand, the improvement being one of the objects of this invention. When the colloidal fine particles are added to a transfer developing solution, there also occur the similar phenomena to those which occur when they are contained in an element of printing plate. U.S. Pat. Nos. 3,547,641 and 3,721,559 disclose that colloidal fine particles are contained in an etching liquid or dampening solution which are used for treatment for printing after the photographic treatment. When the plate is treated with these treating solutions which contain colloidal silica or glycerine alone or in combination, water retentivity of non-image area during printing is improved to increase ink-repellency. However, in case colloidal silica is contained in said treating solution, it is required to add it in an amount of about 10–100 times the amount required in the present invention and even if such large amount is used the effect obtained is lower than that of the present invention and further increase in the amount of colloidal silica for increasing the effect results in reduction of ink-receptivity of silver image areas to cause reduction of printing density and, in some case, to cause emulsification of the ink. The greatest differences from the present invention in the effects are that according to the prior art there are no such effects as prevention of decrease in ink-repellency of non-image areas with the lapse of time when the printing plates are left to stand and prevention of stains of non-image areas with oily materials and stains of image areas and non-image areas with fingerprints. These effects of preventing the problems which occur while the printing plates are left to stand can be obtained only by the present invention.

The technical characteristic of the present invention is that colloidal fine particles or the colloidal fine particles in combination with hygroscopic polyol compounds are contained in the neutralizing solution used in the photographic treatment. This is different from the prior art according to which they are contained in an element of printing plates or a treating solution used for treatment for printing after the photographic treatments. According to the present invention, decrease in ink-repellency of non-image areas and ink-receptivity of image areas with the lapse of time while the printing plates are left to stand after the photographic treatment, especially the former can be prevented. Furthermore, according to the present invention, sticking of oily materials to the surface of the printing plates and leaving of fingerprints on the surface while they are left to stand and during printing and treatment for printing can be prevented. Thus, there can be obtained prints with no stains in non-image areas with ink and fingerprints and having clear printing images without portions on which the ink does not lay due to the fingerprints left. Furthermore, according to the present invention a lithographic printing plate having non-image areas excellent in ink-repellency can be produced without giving adverse effect on the ink receptivity of image areas and clear, collectively excellent prints with no ink stains and with sufficient ink density can be obtained.

The neutralizing solution used in the present invention is one used for neutralization effected subsequent to transfer development treatment in case of lithographic printing plates obtained by application of the silver complex diffusion transfer process. The pH of this neutralizing solution is adjusted to about 3–8 and this neutralizing solution stops the progress of development and simultaneously it has, by neutralization of the printing plates, the very important effects of preventing deterioration of film of binders such as gelatin and the like on the surface of the plate, deterioration of silver images (disappearance of the image surface occurs in extreme case), reduction of ink-receptivity of image areas which are caused by alkali and emulsification of the printing ink which is caused by incorporation of alkali. For the neutralizing solution, water softener such as sodium hexametaphosphate and pH regulator and buffer such as citric acid, acetic acid, boric acid, sulfurous acid and alkali metal salts thereof may be used. Furthermore, hardeners for binders such as organic compounds, e.g., formalin, glyoxal, glutaraldehyde, tannic acid, dimethylolurea, ethylene urea resin, etc. and inorganic compounds, e.g., chrome alum, potash alum, etc. may also be optionally used for preventing wear of the surface of printing plates. The ordinary compositions of these neutralizing solutions may be used in the present invention.

The surface layers of the printing plate according to the present invention comprise a layer containing nuclei for physical development, silver halide emulsion layer, etc. and these surface layers are ink-repellent layers of lithographic printing plates manufactured by plate making treatment. One or more hydrophilic high polymer binders such as galatin (alkali-treated gelatin, acid-treated gelatin, grafted gelatin, acylated gelatin and other modified gelatins are included), starch, albumin, sodium alginate, hydroxyethyl cellulose, gum arabic, polyvinyl alcohol, polyvinylpyrrolidone, carboxymethylcellulose, polyacrylamide, styrene-maleic anhydride copolymer, polyvinylmethyl ether-maleic anhydride copolymer, etc. are generally used for said surface layers.

It is considered that the reason for the fact that the present invention is superior in the effect of preventing stains with ink during printing to the prior art by which colloidal fine particles or hygroscopic polyol compounds are contained in a liquid used for treatment for printing after a photographic treatment is that the surface of binder layer of a printing plate immediately after the treatment with a developing solution is in a softened and swollen state caused by action of alkali agent and so in the case of the present invention according to which colloidal fine particles or the colloidal fine particles with hygroscopic polyol compounds are applied to the surface of a printing plate which is in a wetted state immediately after the developing treatment these materials firmly adhere to the surface to provide a sufficient water retentivity since the adhesiveness of these materials to the surface of the binder layer of the printing plate is superior to the adhesiveness when they are applied after a photographic treatment. It is considered that the amount of these materials (especially the colloidal fine particles) to be added to a treating solution can be 1/10 to 1/100 the amount necessary when they are used in a treatment for printing after a photographic treatment. On the other hand, when said materials are applied at the treatment for printing after a photographic treatment, adhesiveness to the surface of a printing plate is small and they lightly adhere to the surface or they merely rest on the surface.

The neutralizing treatment effected as a photographic treatment subsequent to the developing treatment in the present invention is sufficient to be carried out for 5–30 seconds at room temperature.

When the developing solutions used in the present invention contain organic compounds having mercapto group or thion group or compounds having heterocyclic group containing sulfur atom which improve ink-receptivity of image areas as disclosed in, for example, Japanese Patent Publication No. 486/76 and Japanese Patent Application No. 67409/76, the difference between the oleophilicity and hydrophilicity of the image areas and non-image areas is increased. Furthermore, better results are obtained when said organic compounds which improve ink-receptivity and colloidal fine particles or the colloidal silica with hygroscopic polyol compounds in an amount within the range which does not give adverse effect are contained in an etching liquid or dampening solution used for treatment for printing after a photographic treatment.

Examples of the lithographic printing plates to which the present invention can be applied are those which use silver image areas of positive type or negative type (which uses a direct positive silver halide emulsion in a photosensitive layer) which are rendered ink-receptive and which are disclosed in Japanese Patent Publications No. 16725/73, No. 29446/76, No. 30562/73, No. 15764/76, No. 16803/76, Japanese Utility Model Unexamined Publications (Kokai) No. 5801/73 and No. 43002/74, Japanese Patent Unexamined Publications No. 111103/76 and No. 139401/76, U.S. Pat. Nos. 3,721,559 and 3,490,905, Japanese Patent Applications No. 22829/76, No. 27095/76, No. 95276/76, No. 95274/76 and No. 131371/76, etc. However, the lithographic printing plates to which the present invention can be applied are not limited to those as mentioned above, but also include those which use silver image areas which have been formed by photographic methods such as silver complex diffusion transfer process, physical developing process, chemical developing process, etching bleach process or washing-off process alone or combination of these processes and which have been rendered ink receptive.

The method for making lithographic printing plates according to the present invention is most suitable for making lithographic printing plates obtained by applying the silver complex diffusion transfer process.

The following examples illustrate the present invention but are not intended to limit it in any way. The silica particles having an average size of 5 μ used in the elements of the printing plates in these examples are those clearly distinguishable from colloidal silica used in the present invention.

EXAMPLE 1

On one surface of a paper base both surfaces of which were coated with polyethylene and which had 135 g/m² was provided a matted layer containing silica particles of 5 μ in average size. Another surface was subjected to corona discharge and then provided with an antihalation layer containing carbon black, on which an orthochromatically sensitized high contrast silver chloroiodide emulsion containing silica particles of 5 μ in average size was coated to a coating weight of 1.0 g/m² in terms of silver nitrate. These antihalation layer and emulsion layer contained formaldehyde and ethylene urea resin as hardeners. After being dried, the paper was warmed at 40° C. for 3 days and thereafter a palladium sulfide sol prepared by the following method was coated on the emulsion layer at a rate of 5 m/min.

| Preparation of palladium sulfide sol | | |
| --- | --- | --- |
| Solution A | $PdCl_2$ | 5 g |
| | HCl | 40 ml |
| | Water | 1 l |
| Solution B | $Na_2S$ | 8.6 g |
| | Water | 1 l |

Solutions A and B were mixed under agitation and after 30 minutes the mixture was allowed to pass through a column containing an ion exchange resin prepared for production of pure water to purify it. Then, solution C was added to the purified mixture to obtain a coating solution.

| Solution C | Methylvinyl ether-maleic anhydride copolymer (1.25%) | 100 ml |
|---|---|---|
| | 10% Aqueous solution of saponin | 200 ml |
| | Water | 18,000 ml |

Thus obtained original plate for lithographic printing plate was exposed imagewise by a camera for relief-printing which had the image reversing mechanic and was developed with the following silver complex diffusion transfer developer solution at 30° C. for 60 seconds.

| Transfer developer solution | |
|---|---|
| Water | 1,500 ml |
| Sodium hydroxide | 20 g |
| Sodium sulfite (anhydrous) | 100 g |
| Hydroquinone | 12 g |
| 1-phenyl-3-pyrazolidone | 1 g |
| Sodium thiosulfate | 16 g |
| Potassium iodide | 3 g |
| 1-ethyl-2-mercaptobenzimidazole | 0.05 g |
| 3-mercapto-4-acetamide-5-n-heptyl-1,2,4-triazole | 0.1 g |
| Water to make up 2 l | |

After development, the plate was allowed to pass between two squeezing rollers to remove extra developer solution and immediately thereafter this was treated with a neutralizing solution having the following composition to which the material as shown in Table 1 (colloidal silica was used as a dispersion containing 20% of solid matter) was added at 25° C. for 20 seconds. Extra solution was removed from the plate by rollers and this plate was dried under room temperature and ordinary humidity.

| Neutralizing solution | |
|---|---|
| Water | 600 ml |
| Citric acid | 10 g |
| Sodium citrate | 35 g |
| Water to make up 1 l | |

The lithographic printing plates obtained by said procedures were installed in an offset printing machine, the following etching liquid was applied to the whole surface of the plates and printing was carried out with these printing plates using the following dampening solution. The results are shown in Table 1.

| Etching Liquid | |
|---|---|
| Water | 600 ml |
| Isopropyl alcohol | 400 ml |
| Ethylene glycol | 50 g |
| 3-mercapto-4-acetamide-5-n-heptyl-1,2,4-triazole. | 1 g |

| Dampening solution | |
|---|---|
| Water | 880 ml |
| Citric acid | 6 g |
| Borax | 8.4 g |
| Sodium sulfate (anhydrous) | 25 g |
| Cobalt chloride (hexahydrate) | 2.5 g |
| Ethylene glycol | 100 g |
| Colloidal silica (20% solution) | 28 g |

Table 1

| Neutralizing solution | Colloidal fine particles | Addition amount (g/l) | Hygroscopic polyol compounds | Addition amount (g/l) | Results of *1 printing test | | Results of *2 printing test | | |
|---|---|---|---|---|---|---|---|---|---|
| | | | | | Stains | Lay of ink | Stains | Finger prints | Oil spot |
| 1 | — | — | — | — | Δ | 15 | × | × | × |
| 2 | Colloidal silica | 0.05 | — | — | 0 | 15 | Δ | 0 | Δ |
| 3 | Colloidal silica | 0.5 | — | — | 0 | 15 | 0 | 0 | Δ |
| 4 | Colloidal silica | 1 | — | — | 0 | 15 | 0 | 0 | 0 |
| 5 | Colloidal silica | 5 | — | — | 0 | 25 | 0 | 0 | 0 |
| 6 | Colloidal silica | 10 | — | — | 0 | 40 | 0 | 0 | 0 |
| 7 | Colloidal silica | 0.05 | Glycerine | 10 | 0 | 15 | 0 | 0 | 0 |
| 8 | Colloidal silica | 0.5 | " | 10 | 0 | 15 | 0 | 0 | 0 |
| 9 | Colloidal silica | 1 | " | 10 | 0 | 15 | 0 | 0 | 0 |
| 10 | Colloidal silica | 0.5 | Ethylene glycol | 10 | 0 | 15 | 0 | 0 | 0 |

*1. Results of printing test within one day after photographic treatment.
*2. Results of printing test after the lapse of 10 days under 40° C. and a relative humidity of 60% after photographic treatment.

The printing machine used was A. B. Dick 350 CD (trade name of an offset printing machine manufactured by A. B. Dick Co.). Stain and properties of the printing plates after being left to stand were determined by the following tests.
(i) Stain test: 100 copies were printed with Navy Blue ink of gloss F produced by Dainippon Ink & Chemical Inc. and the degree of the stain was determined by the following three grades.
"O": No stain occurred.
"Δ": Partial or a little stain occurred.
"x": Allover thick stain occurred.

(ii) Fingerprint test: A finger was pressed onto the plate subjected to photographic treatment. Thereafter, the plate was left to stand with warming (40° C., relative humidity 60%, 10 days). Then, printing was carried out using the same ink as used in the stain test. When fingerprint stains (in non-image areas) occurred or the ink did not lay well to the image areas due to the fingerprint, this was determined as "x" and when no special change occurred this was "O".

(iii) Oil spot test: The navy blue ink of gloss F produced by Dainippon Ink & Chemical Inc. was diluted with gasoline and was sprinkled on the surface of printing plate after subjected to photographic treatment. This was left to stand at 40° C. and a relative humidity of 60% for 10 days. Then, printing was carried out with the navy blue ink of gloss F. When non-image areas was completely rendered ink receptive by the oil spot, this was shown by "x". When stain occurred at the initial stage of printing, but the stain disappeared by lightly rubbing it with the etching liquid, this was shown by "Δ". When no problems occurred in the standard printing, this was shown by "O".

(iv) Test for laying of ink: Number of prints required until the density of ink image was stabilized after beginning of printing using a navy blue ink of gloss F manufactured by Dainippon Ink & Chemicals Inc.

EXAMPLE 2

On polyester films of 100 μ thick, surface of which was rendered hydrophilic were coated the palladium sulfide sol prepared in Example 1 at a rate of 5 m/min and then these were dried to obtain original plates for lithographic printing plate. Surface of papers, both surfaces of which were coated with polyethylene were subjected to corona discharge treatment and a gelatin undercoat layer containing titanium oxide was coated on said surface. On said undercoat layer was coated an orthochromatically sensitized high contrast silver chloride emulsion to a coating of 1.0 g/m$^2$ in terms of silver nitrate and this was dried to obtain negative sheets.

Thus obtained negative sheets were exposed imagewise by a vacuum contact printer and then the surface of each negative sheet was allowed to contact with the surface of each of said original plates. This was subjected to developing treatment with the transfer developer used in Example 1 at 30° C. for 30 seconds. Extra developer solution was removed by two squeezing rollers. After the lapse of 60 seconds, the negative sheet was separated from the original plate. Only the original plate were treated with 10 neutralizing solutions 1-10 used in Example 1 at 25° C. for 10 seconds, then extra solution was removed by squeezing rollers and the plates were dried under room temperature and normal humidity to obtain lithographic printing plates. These printing plates were subjected to the same tests as in Example 1 to obtain the similar results with those in Example 1.

What we claim is:

1. In a method for making a lithographic printing plate utilizing the silver complex diffusion process, which method comprises forming an original plate for lithographic printing plate which uses silver image areas formed by a photographic process and rendered ink-receptive and subjecting the plate to photographic treatments of development and neutralization and then to treatment for making the plate insensible to oil, the improvement which comprises a neutralizing solution used for said neutralizing treatment containing colloidal fine particles and a hygroscopic polyol compound, wherein said particles are selected from the group consisting of colloidal silica and colloidal alumina.

2. A method for making a lithographic printing plate according to claim 1, wherein the colloidal fine particles are colloidal silica.

3. A method for making a lithographic printing plate according to claim 1, wherein the hygroscopic polyol compound is at least one compound selected from ethylene glycol, diethylene glycol, α-propylene glycol and glycerine.

4. A method for making a lithographic printing plate according to claim 1, wherein the colloidal fine particles are colloidal silica and the hygroscopic polyol compound is at least one compound selected from ethylene glycol, diethylene glycol, α-propylene glycol and glycerine.

5. A method for making a lithographic printing plate according to claim 4, wherein the content of the colloidal fine particles is 0.01-1 g/l.

6. A method for making a lithographic printing plate according to claim 1, wherein the content of the hygroscopic polyol compound is 0.1-50 g/l.

7. A method for making a lithographic printing plate according to claim 1, wherein the content of the colloidal fine particles is 0.01-1 g/l and the content of the hygroscopic polyol compound is 0.1-50 g/l.

* * * * *